United States Patent
Ogasawara

(10) Patent No.: US 7,298,201 B2
(45) Date of Patent: Nov. 20, 2007

(54) CLOCK BUFFER CIRCUIT HAVING PREDETERMINED GAIN WITH BIAS CIRCUIT THEREOF

(75) Inventor: Kazuo Ogasawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 40 days.

(21) Appl. No.: 11/210,757

(22) Filed: Aug. 25, 2005

(65) Prior Publication Data

US 2006/0055444 A1  Mar. 16, 2006

(30) Foreign Application Priority Data

Aug. 26, 2004  (JP)  ............................. 2004-246645

(51) Int. Cl.
*G05F 3/02*  (2006.01)
(52) U.S. Cl. ....................... 327/543; 327/563; 330/261
(58) Field of Classification Search ...................... None
See application file for complete search history.

(56) References Cited

U.S. PATENT DOCUMENTS

| | | | | |
|---|---|---|---|---|
| 4,442,408 A | * | 4/1984 | Le ............................. | 330/261 |
| 5,220,289 A | * | 6/1993 | Kunitaka .................... | 330/257 |
| 5,347,210 A | * | 9/1994 | Nguyen ...................... | 323/315 |
| 5,493,253 A | * | 2/1996 | Ogou ......................... | 330/256 |
| 5,572,166 A | * | 11/1996 | Gilbert ....................... | 330/254 |
| 5,717,360 A | * | 2/1998 | Vu et al. .................... | 330/253 |
| 6,023,157 A | * | 2/2000 | Kazuno ...................... | 323/312 |
| 6,084,474 A | * | 7/2000 | Lee ............................ | 330/254 |
| 6,252,458 B1 | * | 6/2001 | Shibata ...................... | 330/261 |
| 6,323,732 B1 | * | 11/2001 | Angell et al. .............. | 330/261 |
| 6,466,081 B1 | * | 10/2002 | Eker .......................... | 327/541 |
| 6,563,382 B1 | * | 5/2003 | Yang .......................... | 330/254 |
| 6,753,732 B1 | * | 6/2004 | Moreland ................... | 330/261 |
| 7,215,180 B2 | * | 5/2007 | Nagata et al. .............. | 327/538 |

FOREIGN PATENT DOCUMENTS

JP  5-268068  10/1993

* cited by examiner

*Primary Examiner*—Tuan T. Lam
*Assistant Examiner*—William Hernandez
(74) *Attorney, Agent, or Firm*—McGinn IP Law Group, PLLC

(57) ABSTRACT

Implementing maintenance of a higher speed with fewest possible additional circuits while suppressing deterioration in characteristics of a clock buffer caused by an offset voltage. In a clock buffer circuit comprising a differential amplifier including a pair of load resistances, a pair of differential stage transistors, a constant current source transistor for supplying an operating current to the differential stage transistors, and a bias circuit for supplying to the constant current source transistor a bias voltage according to the resistance value of the load resistances, the bias circuit generates the bias voltage so controlled that the voltage gain of the clock buffer circuit becomes a predetermined value with respect to a variation of the resistance value of the load resistances.

15 Claims, 4 Drawing Sheets

FIG. 2        PRIOR ART
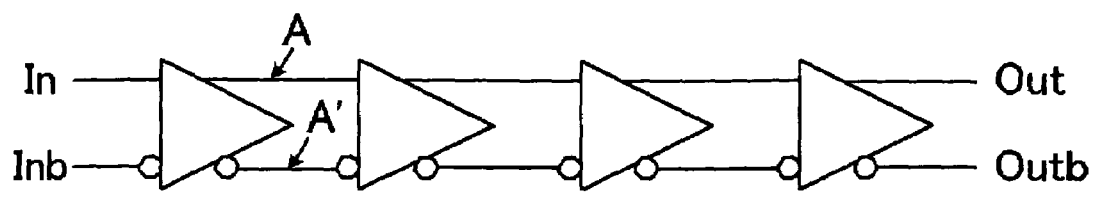
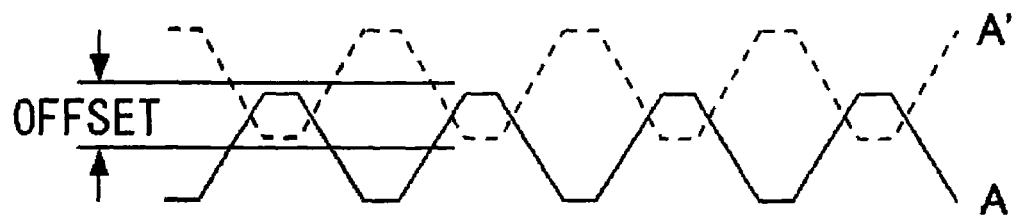

CLOCK BUFFER CIRCUIT HAVING PREDETERMINED GAIN WITH BIAS CIRCUIT THEREOF

FIELD OF THE INVENTION

The present invention relates to a clock buffer circuit. More specifically, the invention relates to a circuit capable of setting the voltage gain of the clock buffer circuit to be constant with respect to a variation of resistance elements.

BACKGROUND OF THE INVENTION

SCL (Source Coupled Logic) circuits are known as a kind of current mode logic circuits capable of performing low-amplitude and high-speed operation. FIG. 1 is a circuit diagram showing the clock buffer circuit that employs a conventional SCL circuit. Referring to FIG. 1, NMOS transistors MN1 and MN2 are transistors that constitute a differential stage. Load resistances R1 and R2 are connected to the drain electrodes of these transistors and a VDD power supply, respectively. An NMOS transistor MN3 is connected between the source electrodes of the NMOS transistors MN1 and MN2 and a VSS power supply. An NMOS transistor MN4 and a resistance R3 constitute a bias current. The drain electrode of the NMOS transistor MN4 is connected to the gate electrode of the NMOS transistor MN4. The source electrode of the NMOS transistor MN4 is connected to the VSS power supply. One end of the resistance R3 is connected to the drain electrode of this transistor, and the other end of the resistance R3 is connected to the VDD power supply. A bias voltage is supplied to the gate electrode of the NMOS transistor MN3 from the drain electrode of the NMOS transistor MN4.

When an input signal In and an inverted input signal Inb are input to the gate electrodes of the NMOS transistors MN1 and MN2, respectively, an output signal Out is output from the drain electrode of the NMOS transistor MN2, and an inverted output signal Outb is output from the drain electrode of the NMOS transistor MN1.

Generally, a plurality of stages of clock buffer circuits is connected in series, as shown in FIG. 2, for waveform shaping and timing adjustment of a clock signal. When an offset voltage is then present between outputs (at nodes A and A' in FIG. 2) of a certain clock buffer circuit, the duty ratios of the output signal Out and the inverted output signal Outb vary, as shown in FIG. 2. Since the plurality of stages of clock buffer circuits is connected in series, the offset voltage may be accumulated and increased, so that the clock signal may disappear at some midpoint, at the worst. The larger the voltage gain of the clock buffer circuit is, the more noticeable this becomes. Since the voltage gain of the conventional clock buffer circuit in FIG. 1 changes proportional to the square root of the load resistances R1 and R2, variations of the load resistances become a main factor for variations of the voltage gain.

Patent Document 1 discloses means for compensating for the offset voltage as described above in SCFL (Source Coupled FET Logic) clock buffer circuits that use GaAs FETs. As an example of a first technique, providing capacitive coupling between stages and applying a direct current bias to a subsequent stage are disclosed. Further, as an example of a second technique, direct current feedback is provided between the stages of the SCFL clock buffer circuits, thereby suppressing the voltage gain and compensating for the offset voltage.

[Patent Document 1]
Japanese Patent Kokai Publication No. JP-A-5-268068

SUMMARY OF THE DISCLOSURE

The example of the first technique in Patent Document 1 has various problems associated with the capacitive coupling. When the capacitive coupling is performed, an HPF (High Pass Filter) is constituted by a coupled capacitance and the input impedance of the subsequent stage. Thus, it is necessary to sufficiently reduce the cut-off frequency of this HPF with respect to the frequency of a transmitted clock. When the cut-off frequency is high, attenuation occurs in the HPF. Thus, the need for increasing the gain of a clock buffer circuit arises. For this reason, the highest operating frequency of the clock buffer circuit is lowered because the bandwidth of the clock buffer circuit with a high gain is generally narrowed.

In order to reduce the cut-off frequency of the HPF, the need for increasing the capacitance value of the coupled capacitance arises, so that a large area is required for circuit integration. Assume that a clock of one GHz is transmitted, for example. Assume that the characteristic impedance of a clock system is 500Ω and the cut-off frequency of the HPF is 100 MHz. Then, when the capacitance value of the coupled capacitance is determined, approximately 3 pF of the coupled capacitance becomes necessary. For this reason, two 3 pF capacitances per buffer become necessary in order to transmit a differential clock, so that a large area becomes necessary.

Further, when the capacitive coupling is employed, a direct-current bias circuit is always required as an input to the subsequent stage. Since this direct-current bias circuit also becomes necessary for each clock buffer circuit, this becomes a factor for increasing the area.

The problem of the example of the second technique in Patent Document 1 is an influence on a transmission speed associated with the direct-current feedback and an influence on the gain of the buffer. When the direct-current feedback is provided, a direct-current gain is limited, so that the influence of the offset voltage becomes favorable by the limitation. However, when the number of stages of connection in series is increased, the influence becomes much more effective by multiplication of the gains of the respective stages. Thus, it follows that the influence cannot become ignored. When the gain is set to a lower value, the gain may be lowered at a clock frequency required, so that clock transmission may also be affected.

Further, since the path of the direct-current feedback acts as a load on a preceding stage, the load resistance is reduced when the gain cannot be set to be high. Thus, the problem of an increase in current consumption also arises. Now assume that the characteristic impedance of the clock system is 500Ω, the value of a feedback resistance becomes 1000Ω when the voltage gain is set to two. The load resistance as seen from the preceding stage becomes 1500Ω. It means that the load with a considerably low resistance value (a heavy load) will be driven.

According to a first aspect of the present invention, a clock buffer circuit constituted from a differential amplifier comprising a pair of load resistances, a pair of differential stage transistors, a constant current source transistor for supplying an operating current to the differential stage transistors, and a bias circuit for supplying to the constant current source transistor a bias voltage according to the resistance value of the load resistances; wherein the bias circuit generates the bias voltage so controlled that the voltage gain of the clock buffer circuit becomes a predetermined value with respect to a variation of the resistance value of the load resistances.

The clock buffer circuit according to the present invention includes the bias current for generating the bias voltage so controlled that the voltage gain of the clock buffer circuit becomes a predetermined value. With this arrangement, the clock buffer circuit that maintains a higher speed while suppressing characteristic deterioration caused by an offset voltage can be implemented.

According to another aspect of the present invention, the clock buffer circuit generates the bias voltage so controlled that the operating current changes inversely proportional to the resistance value of said load resistances raised to the power of a number between one and two (not including one but including two).

According to a further aspect of the present invention, the clock buffer circuit generates the bias voltage so controlled that the operating current changes inversely proportional to the resistance value of said load resistances raised to the power of two, thereby keeping a voltage gain of said clock buffer circuit to be constant with respect to a variation of the resistance value of said load resistances.

The meritorious effects of the present invention are summarized as follows.

When the present invention is used, variations at the time of manufacture of resistance elements and variations of the resistance value of the resistance elements due to temperature can be roughly cancelled, so that speeding up of the clock buffer circuit can be implemented.

Since the variations at the time of manufacture of the resistance elements and the variations of the resistance value of the resistance elements depending on the temperature can be almost cancelled, low power consumption of the clock buffer circuit can be implemented. Further, the circuit is formed of a configuration directly connected with direct-current without extra direct-current feedback path. Thus, the low power consumption can be thereby achieved.

Since the circuit has no capacitive coupling, no direct-current bias circuit, and no extra direct-current feedback path, the invention disclosed in this application can be implemented almost with the clock buffer circuit alone. High integration can be thereby achieved.

Since the circuit has no capacitive coupling, no direct-current bias circuit, and no extra direct-current feedback path, the invention disclosed in this application can be roughly implemented with the clock buffer circuit alone. Thus, simplification of the configuration of the circuit and devices therein can be achieved.

The variations at the time of manufacture of the resistance elements and the variations of the resistance value of the resistance elements due to temperature can be roughly cancelled. Clock transmission can be thereby implemented without extra additional circuit such as an offset canceling circuit or the like. Improvement in transmission efficiency thus can be achieved.

Since the clock transmission can be performed with no additional circuit that is unnecessary for the clock buffer circuit, the circuit can be simplified, and improvement in reliability of an integrated circuit can be achieved.

BRIEF DESCRIPTION OF THE DRAWINGS

FIG. 2 includes diagrams for explaining output waveform distortion caused by an offset voltage of a clock buffer circuit;

PREFERRED EMBODIMENTS OF THE INVENTION

Figure 1:
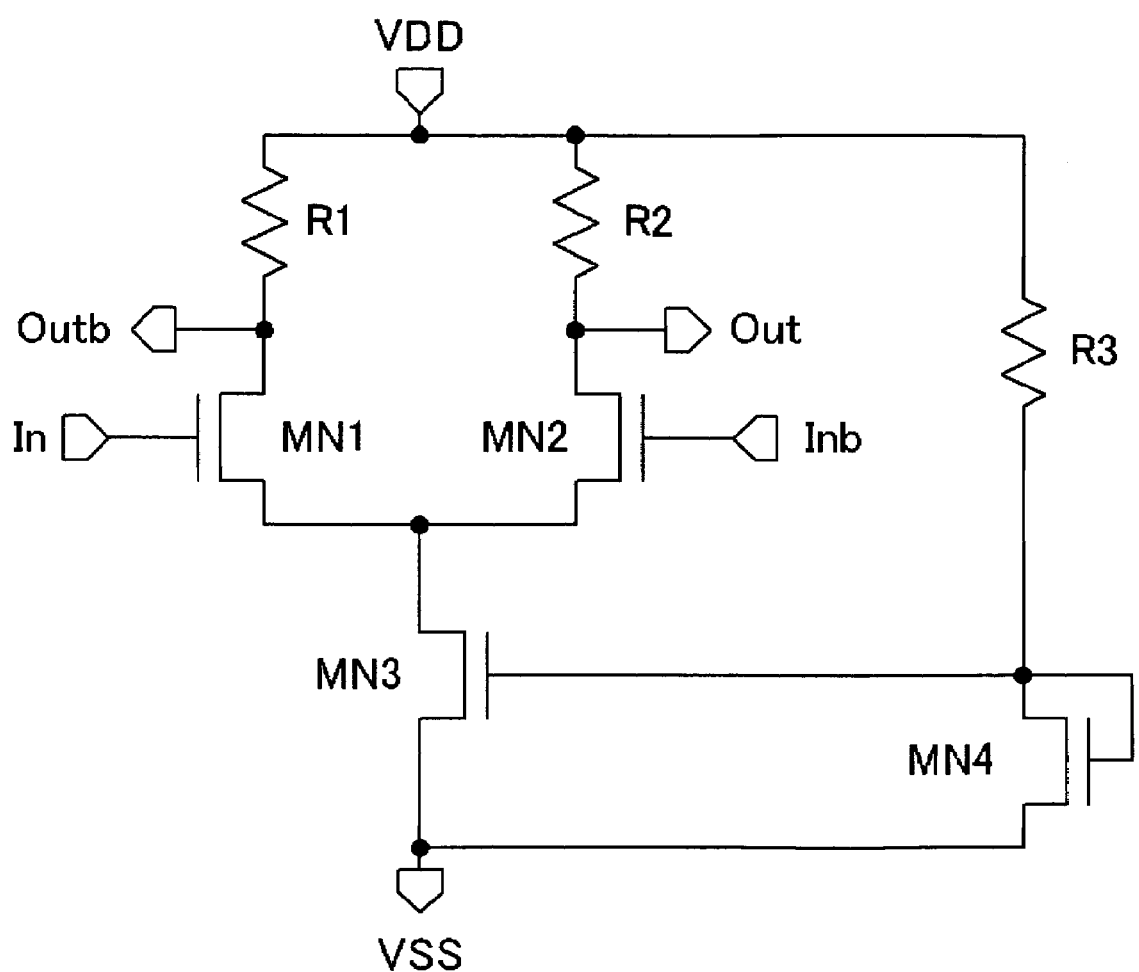
FIG. 1 is a diagram showing a configuration of a clock buffer circuit using conventional SCL.
Figure 3:
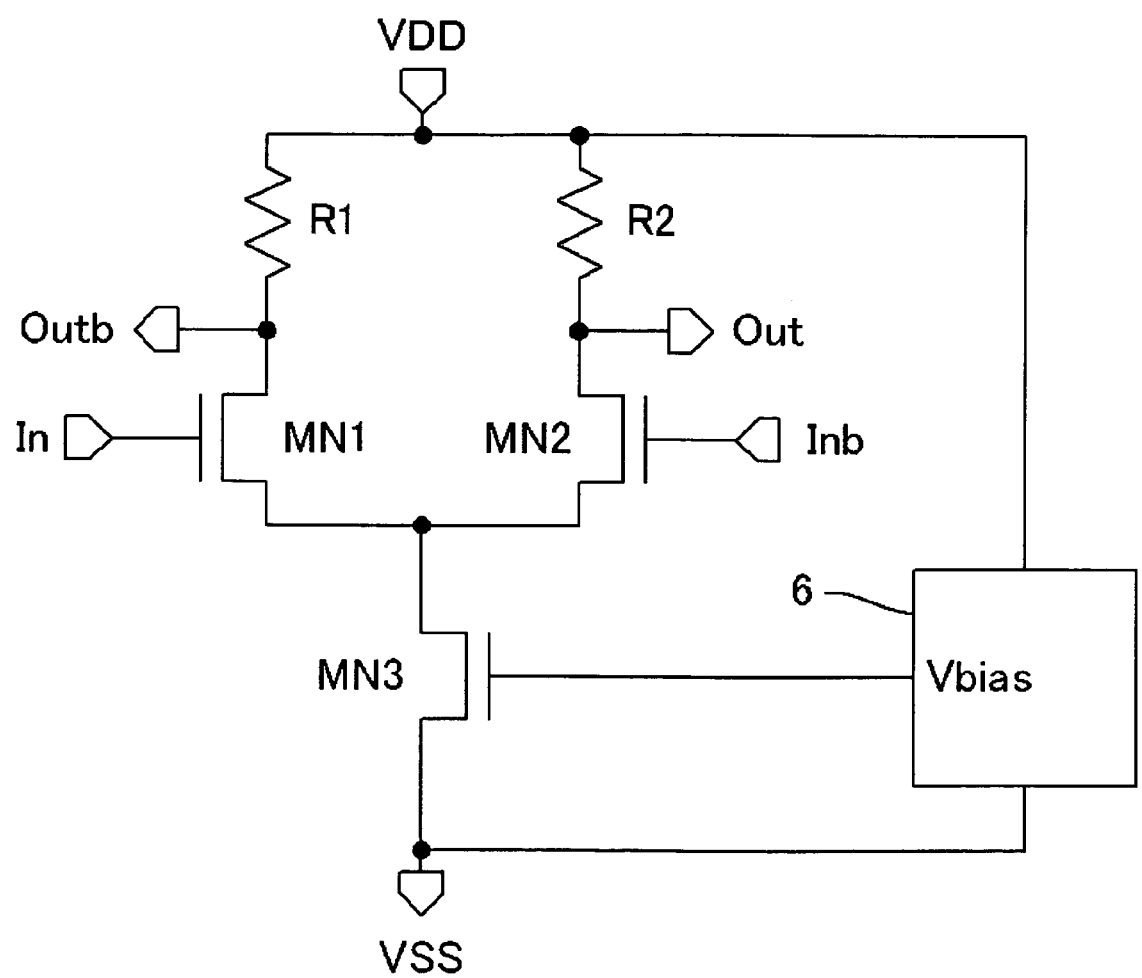
FIG. 3 is a diagram showing a clock buffer circuit using the SCL according to an embodiment of the present invention.

Next, a preferred mode for carrying out the present invention will be described. FIG. 3 is a diagram showing a configuration of an embodiment of the present invention. Referring to FIG. 3, this embodiment is constituted from NMOS transistors MN1 and MN2 forming a differential stage, load resistances R1 and R2 connected between the drain electrodes of these NMOS transistors MN1 and MN2 and a VDD power supply, respectively, an NMOS transistor MN3 which is connected between the source electrodes of the NMOS transistor MN1 and MN2 and a VSS power supply and becomes a constant current source, and a bias circuit 6 for providing a bias voltage Vbias to the gate electrode of the NMOS transistor MN3. Specifically, the bias circuit 6 and the NMOS transistor MN3 supply a constant current to the differential pair according to a variation of the load resistances R1 and R2.

A gain Av of the clock buffer circuit is obtained from the following equation when the mutual conductance of the differential stage is indicated by gm and the resistance value of the load resistances R1 and R2 is indicated by $R_0$:

$$Av = gm * R_0 \tag{1}$$

Assume herein that the current of the constant current source MN3 is indicated by Ib. When the transistor gain coefficient of the NMOS transistors MN1 and MN2 that form the differential pair is then indicated by B, the following relation, in which Vgs and Vt represent a gate-to-source voltage and a threshold voltage, respectively, holds:

$$0.5 * Ib = B * (Vgs - Vt)^2 \tag{2}$$

The mutual conductance gm is determined from the definition and expressed by:

$$gm = \partial Ib / \partial Vgs = 4 * B * (Vgs - Vt) \tag{3}$$

When Equation (2) is substituted into Equation (3) for transformation, the following Equation (4) is obtained:

$$gm = 2 * (2 * B * Ib)^{1/2} \tag{4}$$

When Equation (4) is substituted into Equation (1), the following Equation (5) is obtained:

$$Av = 2 * (2 * B * Ib)^{1/2} * R_0 \tag{5}$$

As clear from Equation (5), it can be seen that by changing the bias current Ib inversely proportional to the square of the resistance value $R_0$ with respect to a variation of the resistance value $R_0$ of the load resistances, the gain Av is kept constant. In the present invention, by changing the bias current Ib inversely proportional to the square of the resistance value $R_0$ with respect to a variation of the load resistance value $R_0$ so as to make the gain constant, the gain Av is kept constant. In clock transmission using the clock buffer circuit or the like, however, the clock buffer circuit is often driven to a saturation region thereof, for use. In the method of use as described above, when the bias current Ib is changed inversely proportional to the square of the resistance value, amplitude variation in the saturation region will occur. Thus, when the bias current Ib is changed inversely proportional to the resistance value raised to power of a number between one and two (not including one but including two) so as to avoid this and to make the gain constant, the amplitude variation and gain variation in the saturation region can be optimized.

First Embodiment

Figure 4:
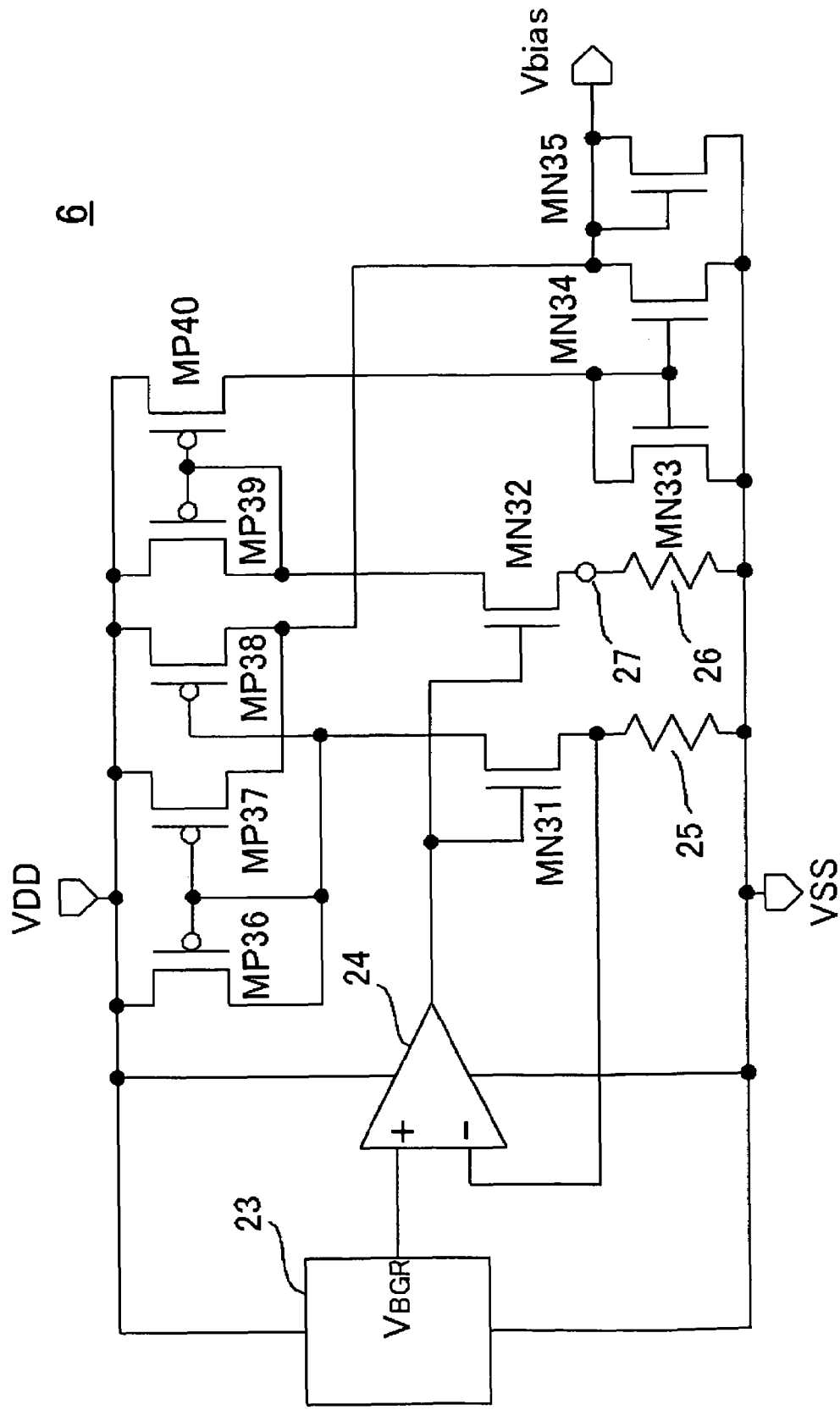
FIG. 4 is a diagram showing a configuration of a bias circuit of the clock buffer circuit according to an embodiment of the present invention.

FIG. 4 is a circuit diagram showing a configuration of the bias circuit 6 in a first embodiment of the present invention. The output of a band-gap reference voltage source 23 is connected to the positive-phase input terminal of an operational amplifier 24. The output of the operational amplifier 24 is connected to the gate electrodes of NMOS transistors MN31 and MN32 for performing voltage-to-current conversion. The source electrodes of the NMOS transistors MN31 and MN32 are respectively connected to one end of an internal resistor 25 and one end of an external reference resistor 26 through an external resistance terminal 27. The other ends of the internal resistor 25 and the external reference resistor 26 are connected to the VSS power supply. The internal resistor 25 has the same structure as that of the load resistances R1 and R2 in FIG. 3, and the relative accuracy with respect to the load resistances R1 and R2 is guaranteed. The external reference resistor 26 is the resistor of which absolute accuracy is guaranteed.

The source electrode of the NMOS transistor MN31 is connected to the inverting input terminal of the operational amplifier 24. PMOS transistors MP36, MP37, and MP38 with source electrodes thereof connected to the VDD power supply and gate electrodes thereof connected to one another constitute a first current mirror circuit. The drain electrode of the NMOS transistor MN31 is connected to the drain electrode and gate electrode of the PMOS transistor MP36. An input current to the first current mirror circuit is supplied to the PMOS transistor MP36.

PMOS transistors MP39 and MP40 with source electrodes thereof connected to the VDD power supply and gate electrodes thereof connected to each other constitute a second current mirror circuit. The drain electrode of an NMOS transistor MN32 is connected to the drain electrode and gate electrode of the PMOS transistor MP39. An input current to the second current mirror circuit is supplied to the PMOS transistor MP39.

NMOS transistors MN33 and MN34 with source electrodes thereof connected to the VSS power supply and gate electrodes thereof connected to each other constitute a third current mirror circuit. The drain electrode of the PMOS transistor MP40 of the second current mirror circuit is connected to the drain electrode and gate electrode of the NMOS transistor MN33. A mirrored current output from the second current mirror circuit is supplied to the NMOS transistor MN33 as an input current to the third current mirror circuit.

The drain electrodes of the PMOS transistors MP37 and MP38 of the first current mirror circuit are connected to the drain electrode of the NMOS transistor MN34 and the gate electrode and drain electrode of the NMOS transistor MN35, and becomes the output terminal of the bias circuit 6. The source electrode of the NMOS transistor MN35 is connected to the VSS power supply. Across the VDD power supply and the VSS power supply are connected the band-gap reference voltage source 23, and the operational amplifier 24 as well, for supplying operating voltages.

The first embodiment of the present invention in FIG. 4 operates as follows: The output voltage of the band-gap reference voltage source 23 is input to the positive phase (non-inverted) input terminal (+) of the operational amplifier 24, and voltage-to-current conversion is performed by the NMOS transistor MN31 and the internal resistor 25. This is because the positive phase input terminal and inverting input terminal (−) of the operational amplifier 24 perform a feedback operation so that the potentials thereof become the same when an input offset voltage is not present.

For this reason, when the output voltage of the band-gap reference voltage source 23 is indicated by $V_{BGR}$ and the resistance value of the internal resistor 25 is indicated by $R_{INT}$, a current $I_{31}$ that flows through the NMOS transistor MN31 is determined as follows:

$$I_{31}=V_{BGR}/R_{INT} \qquad (6)$$

Likewise, the voltage-to-current conversion is performed by the NMOS transistor MN32 and the external reference resistor 26 connected through the external resistance terminal 27. When the resistance value of the external reference resistor 26 is indicated by $R_{EXT}$, a current $I_{32}$ that has undergone the voltage-to-current conversion is determined by:

$$I_{32}=V_{BGR}/R_{EXT} \qquad (7)$$

The currents $I_{31}$ and $I_{32}$ that have undergone the voltage-to-current conversion are mirrored by the PMOS transistors MP36, MP37, and MP38 and the PMOS transistors MP39 and MP40 that constitute the current mirror circuits, respectively. Since the current $I_{31}$ is mirrored at a mirror ratio of one to two, the current $I_{31}$ becomes twice as large as that determined by Equation (6). The current $I_{32}$ mirrored by the PMOS transistors MP39 and MP40 flows through the current mirror circuit constituted from the NMOS transistors MN33 and MN34. The drain electrode of the NMOS transistor MN34 is connected to the drain electrode of the PMOS transistor MP37 and the drain electrode of the PMOS transistor MP38, thereby constituting a current synthesis circuit.

The current value of a current Io that flows through the drain electrode of the NMOS transistor MN35 connected to the constant current source transistor MN34 becomes as follows:

$$Io=2*I_{31}-I_{32} \qquad (8)$$

When the resistance value of the internal resistor 25 is set to $R_{INT}=R_{EXT}*(1+a)$, Equation (8) is transformed to become as follows:

$$Io = 2 * V_{BGR}/(R_{EXT} *(1+a)) - V_{BGR}/R_{EXT} \qquad (9)$$
$$\approx (V_{BGR}/R_{EXT})*(1-2*a)$$

Normally, the value of a becomes the value of approximately 10% to 20% at the maximum. Thus, Equation (9) shows that a current approximately in inverse proportional to the square of the resistance value of the internal resistor with respect to a variation of the internal resistor is supplied.

Second Embodiment

The mirror ratio of the current mirror circuit constituted from the PMOS transistors MP36, MP37, and MP38 and the mirror ratio of the current mirror circuit constituted from the PMOS transistors MP39 and MP40 in the first embodiment of the present invention shown in FIG. 4 was set to 1:2 and 1:1, respectively.

In a certain application circuit, it is sometimes preferable that intermediate setting is performed so that the gain becomes constant and the amplitude is reduced. Now, the current mirror ratio of the PMOS transistors MP36, MP37, and MP38 and the current mirror ratio of the PMOS transistors MP39 and MP40 are 1:2+α and 1:1+α, respectively. The current value of a current Io2 that flows through the drain electrode of the NMOS transistor MP35 becomes as follows, using Equation (8):

$$Io2=(2+\alpha)*I_{31}-(1+\alpha)*I_{32} \quad (10)$$

When the resistance value of the internal resistor 25 is expressed as $R_{INT}=R_{EXT}*(1+\alpha)$, Equation (10) is transformed into the following Formula:

$$Io2 = (2 + \alpha) * V_{BGR}/(R_{EXT} * (1 + a)) - (1 + \alpha) * V_{BGR}/R_{EXT} \quad (11)$$
$$\approx (V_{BGR}/R_{EXT}) * (1 - a * (2 + \alpha))$$

When α is set to −0.5, it is shown that the current inversely proportional to the resistance value of the internal resistor raised to the power of one and a half is supplied, as described in the first embodiment. When α is set to one, it is shown that the current inversely proportional to the resistance value of the internal resistor raised to the power of three is supplied, as described in the first embodiment.

The second embodiment was described using FIG. 4. The second embodiment shows that by adding the factor of α to the mirror ratio of the current mirror circuit, the current inversely proportional to an arbitrary multiplier factor can be supplied.

The foregoing description was made in connection with the embodiments of the present invention. The present invention, however, is not limited to the embodiments described above, and naturally includes various variations and modifications that could be made by those skilled in the art within the scope of the gist of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock buffer circuit comprising:
   a differential amplifier circuit comprising:
   two load resistances;
   two differential stage transistors connected respectively to said load resistances;
   two inputs connected respectively to gates of said differential stage transistors;
   two outputs connected respectively to said differential stage transistors; and
   a constant current source transistor connected to said differential stage transistors, for supplying an operating current to said differential stage transistors; and
   a bias circuit for supplying to a gate of said constant current source transistor a bias voltage, wherein
   said bias circuit generates said bias voltage such that a voltage gain of said clock buffer circuit becomes a predetermined value irrespective of a variation of the resistance value of said load resistances,
   said bias circuit comprises a transistor connected to said constant current source transistor wherein the transistor is formed between a current mirror circuit and said constant current source transistor, and
   a current synthesized from a current generated by application of a reference voltage to an internal resistor and a current generated by application of the reference voltage to an external reference resistor is fed as an input current to said current mirror circuit.

2. A clock buffer circuit comprising:
   a differential amplifier circuit comprising:
   two load resistances;
   two differential stage transistors connected respectively to said load resistances;
   two inputs connected respectively to gates of said differential stage transistors;
   two outputs connected respectively to said differential stage transistors; and
   a constant current source transistor connected to said differential stage transistors for supplying an operating current to said differential stage transistors; and
   a bias circuit for supplying to a gate of said constant current source transistor a bias voltage, wherein
   said bias circuit generates said bias voltage such that said operating current changes inversely proportional to a resistance value of said load resistances raised to a predetermined exponent greater than one but not greater than two.

3. A clock buffer circuit comprising:
   a differential amplifier circuit comprising:
   two load resistances;
   two differential stage transistors connected respectively to said load resistances;
   two inputs connected respectively to gates of said differential stage transistors;
   two outputs connected respectively to said differential stage transistors; and
   a constant current source transistor connected to said differential stage transistors for supplying an operating current to said differential stage transistors; and
   a bias circuit for supplying to a gate of said constant current source transistor a bias voltage, wherein
   said bias circuit generates said bias voltage such that said operating current changes inversely proportional to a resistance value of said load resistances raised to a power of two, thereby keeping a voltage gain of said clock buffer circuit to be constant.

4. The clock buffer circuit according to claim 2, wherein said bias circuit comprises a transistor connected to said constant current source wherein the transistor is formed between a current mirror circuit and said constant current source transistor and a current synthesized from a current generated by application of a reference voltage to an internal resistor and a current generated by application of the reference voltage to an external reference resistor is fed as an input current to said current mirror circuit.

5. The clock buffer circuit according to claim 3, wherein said bias circuit comprises a transistor connected to said constant current source wherein the transistor is formed between a current mirror circuit and said constant current source transistor and a current synthesized from a current generated by application of a reference voltage to an internal resistor and a current generated by application of the reference voltage to an external reference resistor is fed as an input current to said current mirror circuit.

6. The clock buffer circuit according to claim 1, wherein said bias circuit comprises:
   a first voltage-to-current conversion circuit for outputting a current that flows by applying a reference voltage to an internal resistor therein;
   a second voltage-to-current conversion circuit for outputting a current that flows by applying the reference voltage to an external reference resistor therein;
   a first current mirror circuit receiving an output current of said first voltage-to-current conversion circuit, for outputting a mirrored current at a predetermined mirror ratio;
   a second current mirror circuit receiving an output current of said second voltage-to-current conversion circuit, for outputting a mirrored current at a predetermined mirror ratio; and
   a transistor connected to said constant current source wherein the transistor is formed between a current mirror circuit and said constant current source transistor;
   provided that a current obtained by subtracting the mirrored current output from said second current mirror circuit from a mirrored current output from said first current mirror circuit is passed through said transistor connected to said constant current source transistor through said current mirror circuit formed therebetween.

7. The clock buffer circuit according to claim 2, wherein said bias circuit comprises:
   a first voltage-to-current conversion circuit for outputting a current that flows by applying a reference voltage to an internal resistor therein;
   a second voltage-to-current conversion circuit for outputting a current that flows by applying the reference voltage to an external reference resistor therein;
   a first current mirror circuit receiving an output current of said first voltage-to-current conversion circuit, for outputting a mirrored current at a predetermined mirror ratio;
   a second current mirror circuit receiving an output current of said second voltage-to-current conversion circuit, for outputting a mirrored current at a predetermined mirror ratio; and
   a transistor connected to said constant current source transistor wherein the transistor is formed between a current mirror circuit and said constant current source transistor;
   provided that a current obtained by subtracting the mirrored current output from said second current mirror circuit from a mirrored current output from said first current mirror circuit is passed through said transistor connected to said constant current source transistor through said current mirror circuit formed therebetween.

8. The clock buffer circuit according to claim 3, wherein said bias circuit comprises:
   a first voltage-to-current conversion circuit for outputting a current that flows by applying a reference voltage to an internal resistor therein;
   a second voltage-to-current conversion circuit for outputting a current that flows by applying the reference voltage to an external reference resistor therein;
   a first current mirror circuit receiving an output current of said first voltage-to-current conversion circuit, for outputting a mirrored current at a predetermined mirror ratio;
   a second current mirror circuit receiving an output current of said second voltage-to-current conversion circuit, for outputting a mirrored current at a predetermined mirror ratio; and
   a transistor connected to said constant current source transistor wherein the transistor is formed between a current mirror circuit and said constant current source transistor;
   provided that a current obtained by subtracting the mirrored current output from said second current mirror circuit from a mirrored current output from said first current mirror circuit is passed through said transistor connected to said constant current source transistor through said current mirror circuit formed therebetween.

9. The clock buffer circuit according to claim 2, wherein said bias circuit comprises a transistor connected to said constant current source transistor wherein the transistor is formed between a current mirror circuit and said constant current source transistor.

10. The clock buffer circuit according to claim 2, wherein a current synthesized from a current generated by application of a reference voltage to an internal resistor and a current generated by application of the reference voltage to an external reference resistor is fed as an input current to a current mirror circuit.

11. The clock buffer circuit according to claim 3, wherein said bias circuit comprises a transistor connected to said constant current source transistor wherein the transistor is formed between a current mirror circuit and said constant current source transistor.

12. The clock buffer circuit according to claim 3, wherein a current synthesized from a current generated by application of a reference voltage to an internal resistor and a current generated by application of the reference voltage to an external reference resistor is fed as an input current to a current mirror circuit.

13. A clock buffer comprising a plurality of clock buffer circuits according to claim 1, wherein:
   said clock buffer circuits are coupled in series;
   said clock buffer circuits are coupled without use of capacitive coupling;
   said clock buffer circuits are coupled without use of a direct current bias circuit between said clock buffer circuits; and
   said clock buffer circuits are coupled without use of a direct current feedback path between said clock buffer circuits.

14. A clock buffer comprising a plurality of clock buffer circuits according to claim 2, wherein:
   said clock buffer circuits are coupled in series;
   said clock buffer circuits are coupled without use of capacitive coupling;
   said clock buffer circuits are coupled without use of a direct current bias circuit between said clock buffer circuits; and said clock buffer circuits are coupled without use of a direct current feedback path between said clock buffer circuits.

15. A clock buffer comprising a plurality of clock buffer circuits according to claim 3, wherein:
said clock buffer circuits are coupled in series;
said clock buffer circuits are coupled without use of capacitive coupling;
said clock buffer circuits are coupled without use of a direct current bias circuit between said clock buffer circuits; and
said clock buffer circuits are coupled without use of a direct current feedback path between said clock buffer circuits.

* * * * *